United States Patent
Mourant

(10) Patent No.: US 12,424,721 B2
(45) Date of Patent: Sep. 23, 2025

(54) WIDEBAND PASSIVE BALUN INCLUDING SEPARATE FIRST AND SECOND HIGH-PASS FILTERS HAVING INPUTS THEREOF RESISTIVELY CONNECTED TO GROUND

(71) Applicant: MACOM Technology Solutions Holdings, Inc., Lowell, MA (US)

(72) Inventor: Jean-Marc Mourant, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 297 days.

(21) Appl. No.: 18/104,315

(22) Filed: Feb. 1, 2023

(65) Prior Publication Data

US 2024/0258675 A1    Aug. 1, 2024

(51) Int. Cl.
*H01P 5/10* (2006.01)
*H03H 7/42* (2006.01)

(52) U.S. Cl.
CPC ............... *H01P 5/10* (2013.01); *H03H 7/42* (2013.01)

(58) Field of Classification Search
CPC ........................................................ H01P 5/10
USPC ........................................................ 333/26
See application file for complete search history.

(56) References Cited

U.S. PATENT DOCUMENTS

| | | |
|---|---|---|
| 7,167,698 B2 | 1/2007 | Katz |
| 7,880,557 B2 | 2/2011 | Jiang |
| 8,471,645 B2 | 6/2013 | Ujita |
| 9,300,022 B2 | 3/2016 | Vaisman |
| 9,306,540 B2 | 4/2016 | Lin |
| 9,401,770 B1 | 7/2016 | Noll |
| 9,407,211 B1 | 8/2016 | McNamara |
| 9,444,410 B1 | 9/2016 | Zhou |
| 9,736,000 B2 | 8/2017 | Dabiri |
| 9,787,519 B2 | 10/2017 | Dabiri |
| 10,056,870 B1 | 8/2018 | Fujii |
| 11,228,326 B2 | 1/2022 | Kang |
| 2002/0097107 A1* | 7/2002 | Burns et al. ......... H05K 1/0239 333/33 |
| 2003/0042992 A1* | 3/2003 | Frank ...................... H03H 7/422 333/128 |
| 2016/0126612 A1* | 5/2016 | Lin et al. .................. H01P 5/12 333/26 |

OTHER PUBLICATIONS

Jean-Marc Mourant, A Broadband Planar Image Reject Mixer, M/A-COM Microelectronics Division, 1994 IEEE MTI-S Digest, CH3389-4/94/0000-1637$01.00 © 1994 IEEE 1637-1640.

* cited by examiner

*Primary Examiner* — Benny T Lee

(74) *Attorney, Agent, or Firm* — Sheridan Ross P.C.

(57) ABSTRACT

A balun is enhanced with design features that extend the operational bandwidth of the balun allowing the balun to operate at lower frequencies. The design enhancements also suppress resonances that otherwise cause sudden power drops at a resonance frequency while a load is connected between the balun's differential outputs.

17 Claims, 17 Drawing Sheets

WIDEBAND PASSIVE BALUN INCLUDING SEPARATE FIRST AND SECOND HIGH-PASS FILTERS HAVING INPUTS THEREOF RESISTIVELY CONNECTED TO GROUND

TECHNICAL FIELD

The subject disclosure relates generally to electrical circuit design and, in particular, to baluns.

BACKGROUND

In electrical circuit design, differential signals are often used in applications requiring high isolation or low second order distortion. Baluns, or balanced-to-unbalanced transformers, are often used to convert a single-ended signal to a differential signal for use in such applications. For example, doubly balanced mixers typically include two baluns, which convert two single-ended signal inputs to two corresponding differential signals for processing by a diode ring mixer.

The bandwidth within which a balun can operate with acceptable insertion and return loss is typically limited. A balun's performance can be improved if this bandwidth can be extended with minimal trade-off in terms of insertion and return loss. Moreover, many wide-band baluns experience undesirable resonances due to energy dissipation at certain resonance frequencies.

The above-described description is merely intended to provide a contextual overview of current balun designs and is not intended to be exhaustive.

SUMMARY OF THE INVENTION

The following presents a simplified summary in order to provide a basic understanding of some aspects described herein. This summary is not an extensive overview of the disclosed subject matter. This summary is intended to neither identify key nor critical elements of the disclosure nor delineate the scope thereof. The sole purpose of the summary is to present some concepts in a simplified form as a prelude to the more detailed description that is presented later.

In one or more embodiments, a balun is provided, comprising circuitry configured to convert a single-ended signal received at an input node to a differential signal and to output the differential signal across a first output node and a second output node; a first high-pass filter connected between the input node and the first output node; a second high-pass filter connected between the input node and the second output node; and a transmission line connected between an input of the first high-pass filter and ground.

Also, one or more embodiments provide a method, comprising receiving, at an input node of a balun, a single-ended signal from a signal source; and converting the single-ended signal to a differential signal across a first output node and a second output node of the balun, wherein the balun comprises: a first high-pass filter connected between the input node and the first output node, and a second high-pass filter connected between the input node and the second output node.

Also, according to one or more embodiments, a circuit for converting a single-ended signal to a differential signal is provided, comprising an input node configured to receive a single-ended signal; a first output node and a second output node configured to output a differential signal based on the single-ended signal; a first series capacitor on the first output node; a first transmission line connected between the first output node and ground; a second series capacitor on the second output node; and a second transmission line connected between the second output node and ground.

DETAILED DESCRIPTION OF THE INVENTION

Figure 1:
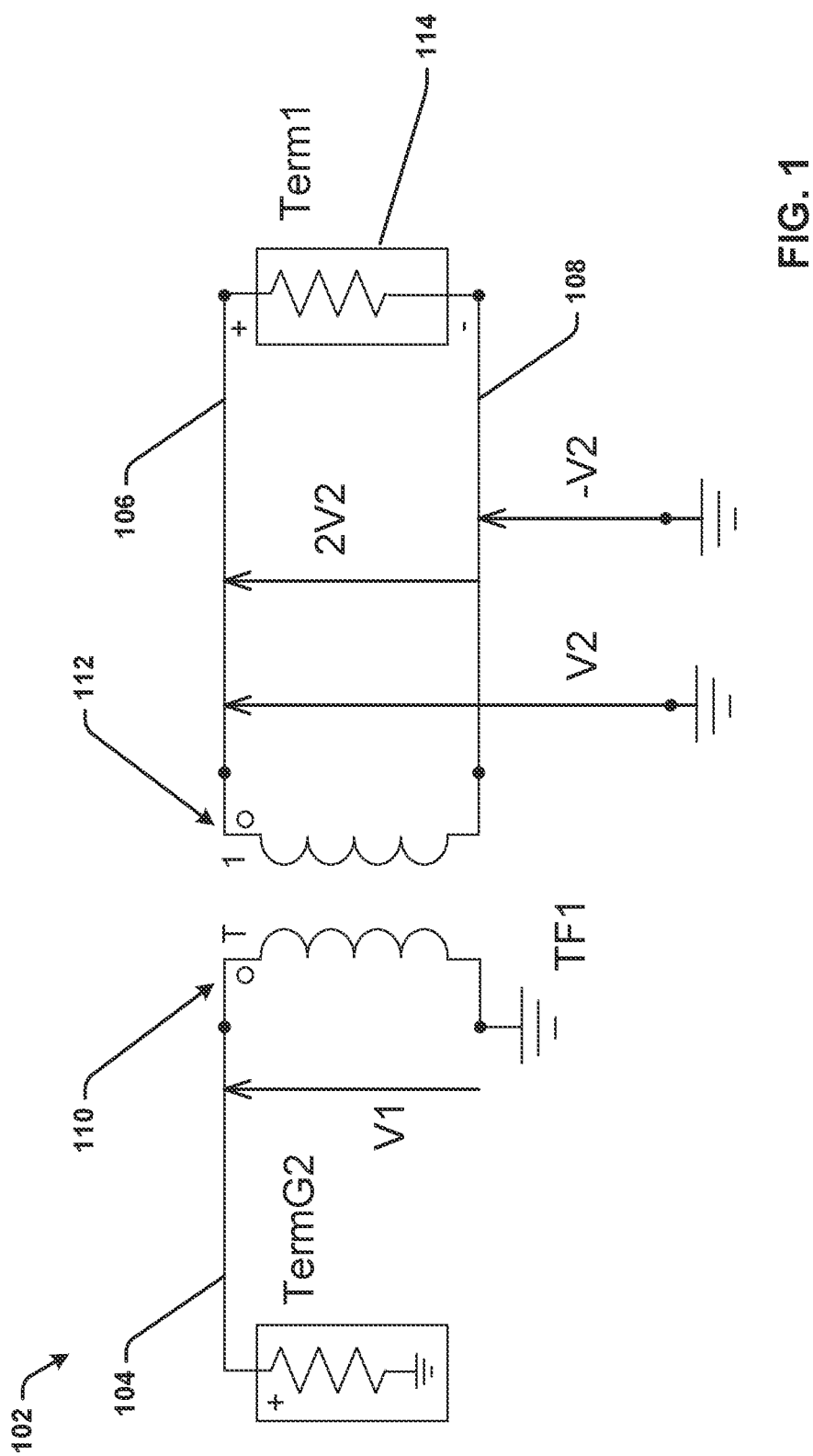
FIG. 1 is a circuit diagram of an example balun capable of converting a single-ended signal into a differential signal output.

The disclosure herein is described with reference to the drawings, wherein like reference numerals are used to refer to like elements throughout the detailed description. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

FIG. 1 is a circuit diagram of an example balun 102 capable of converting a single-ended signal received at input node 104 into a differential signal output across output nodes 106 and 108. A balun is a matched passive component, meaning that the single-ended impedance and the differential impedance are constant. In the example depicted in FIG. 1, a voltage V1 is applied between the input node 104 and ground (a single-ended input signal), and this voltage V1 is transformed into a differential signal across output nodes 106 and 108. This differential signal is the difference between a first voltage between the first output node 106 and ground and a second voltage between the second output node 108 and ground. FIG. 1 depicts a scenario in which these first and second voltages are equal in amplitude (V2) and opposite in phase (−V2). This yields a differential signal of 2V2, or twice the amplitude, across output nodes 106 and 108. In various implementations, a balun 102 can be designed such that the input and output impedances are the same (e.g., a 1:1 ratio) or can be designed to transform the impedance from the input to the output (e.g., at a 1:2 ratio for the input and output differential impedance).

Baluns differ from 180-degree hybrids in key aspects. In some designs, the impedances of the balun may be matched at the single-ended input and the differential output but may not be matched on all terminals with reference to ground. For example, in the example balun 102 depicted in FIG. 1, the impedance between each terminal of the differential output (labeled Term1 in FIG. 1) is infinite. In general, a balun operates by power matching the desired differential mode and mismatching the undesired common mode (between terminal and ground). The common mode impedances are typically mismatched but also equal, ensuring that the common mode voltages are equal in amplitude and out of phase. Because baluns do not work by phase cancellation, they can operate across a high bandwidth. In contrast with baluns, a 180-degree hybrid is matched on all terminals, and for both the common and differential modes. This can be useful if long transmission lines are to be connected between the hybrid and the load.

Figure 2:
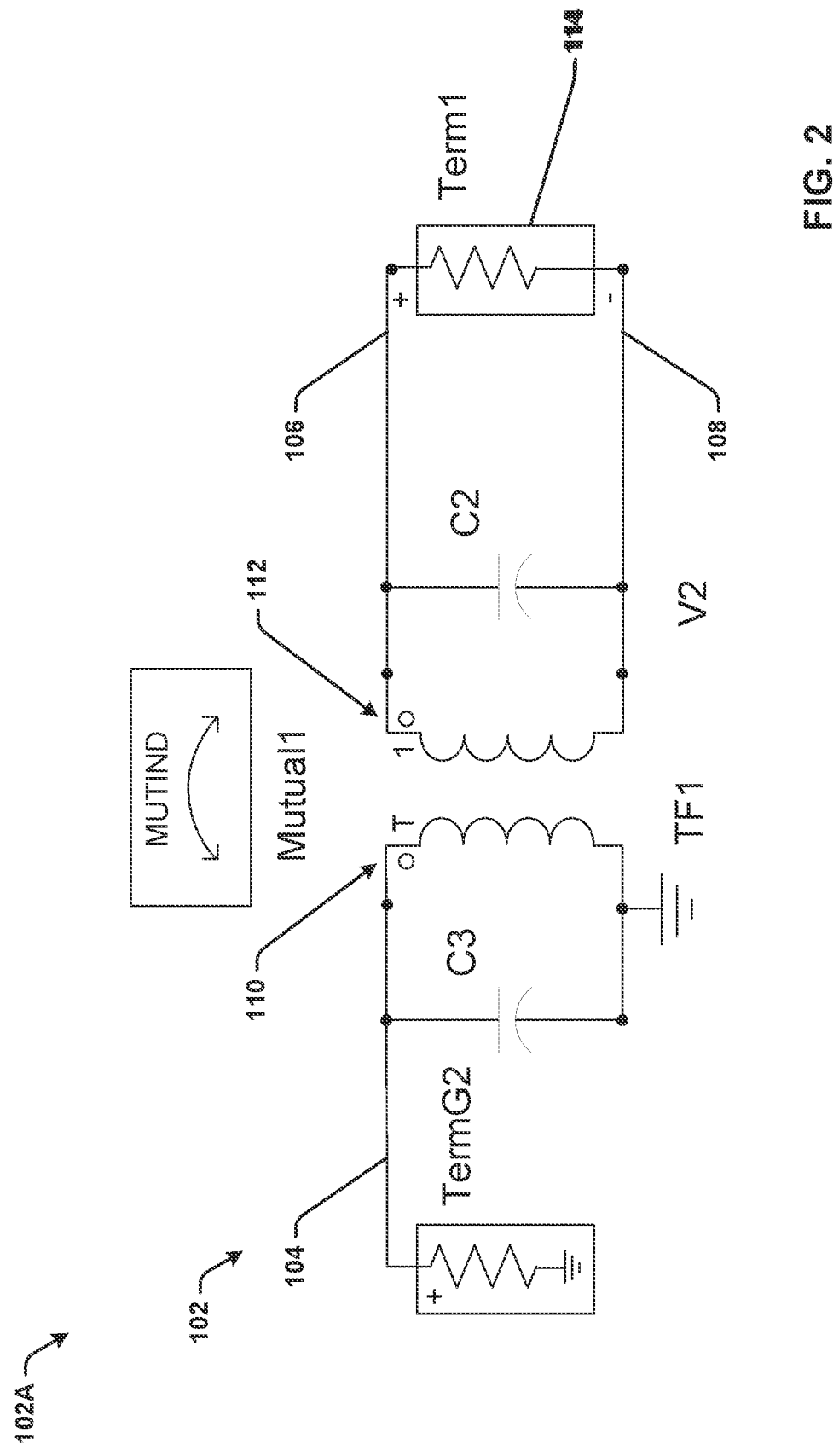
FIG. 2 is a circuit diagram of an example balun in which capacitors have been added to resonate out inductance.

Different design approaches can be used to implement RF baluns. For example, the example balun 102 depicted in FIG. 1 uses coupled inductors, represented by coils 110 and 112. To match this balun 102 to a real impedance, the inductance can be resonated out, as illustrated in FIG. 2, by adding a capacitor C3 between the input node 104 and ground, and a capacitor C2 between the output nodes 106 and 108. The resulting balun 102A works well but has a limited bandwidth. To increase the bandwidth, the inductance can be increased to reduce the loaded quality factor Q. If the inductance is increased, the parasitic capacitance between the primary and secondary coils 110 and 112 increases. This degrades the phase and amplitude balance since the common mode impedances become unequal.

Figure 3:
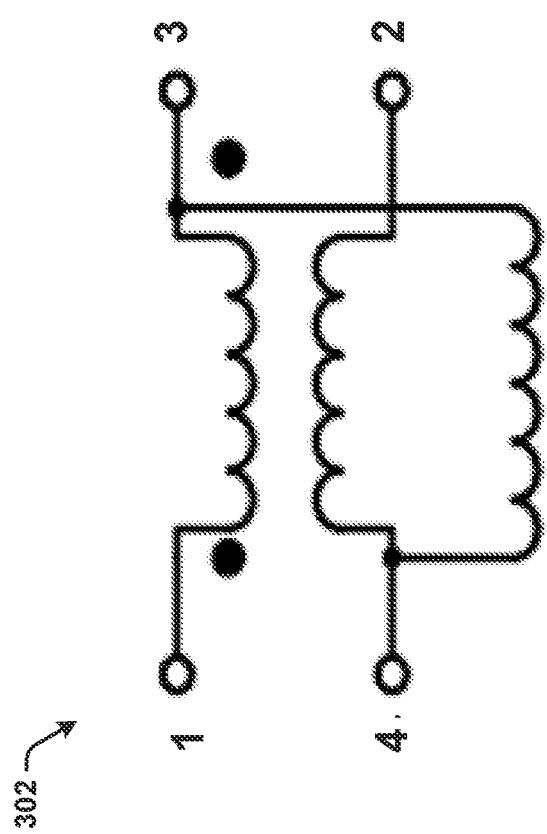
FIG. 3 is a circuit diagram of an example transmission line balun designed to distribute the parasitic capacitance and obtain additional bandwidth.

FIG. 3 is a circuit diagram of an example transmission line balun 302 designed to distribute the parasitic capacitance and obtain additional bandwidth. In this example, node 1 is the input node, node 4 is connected to ground, node 3 is the first output node (e.g., the output through leg), and node 2 is the second output node (e.g., the output coupled leg). In this approach, the parasitic capacitance described above in connection with FIG. 2 is embedded into a transmission line.

Figure 4:
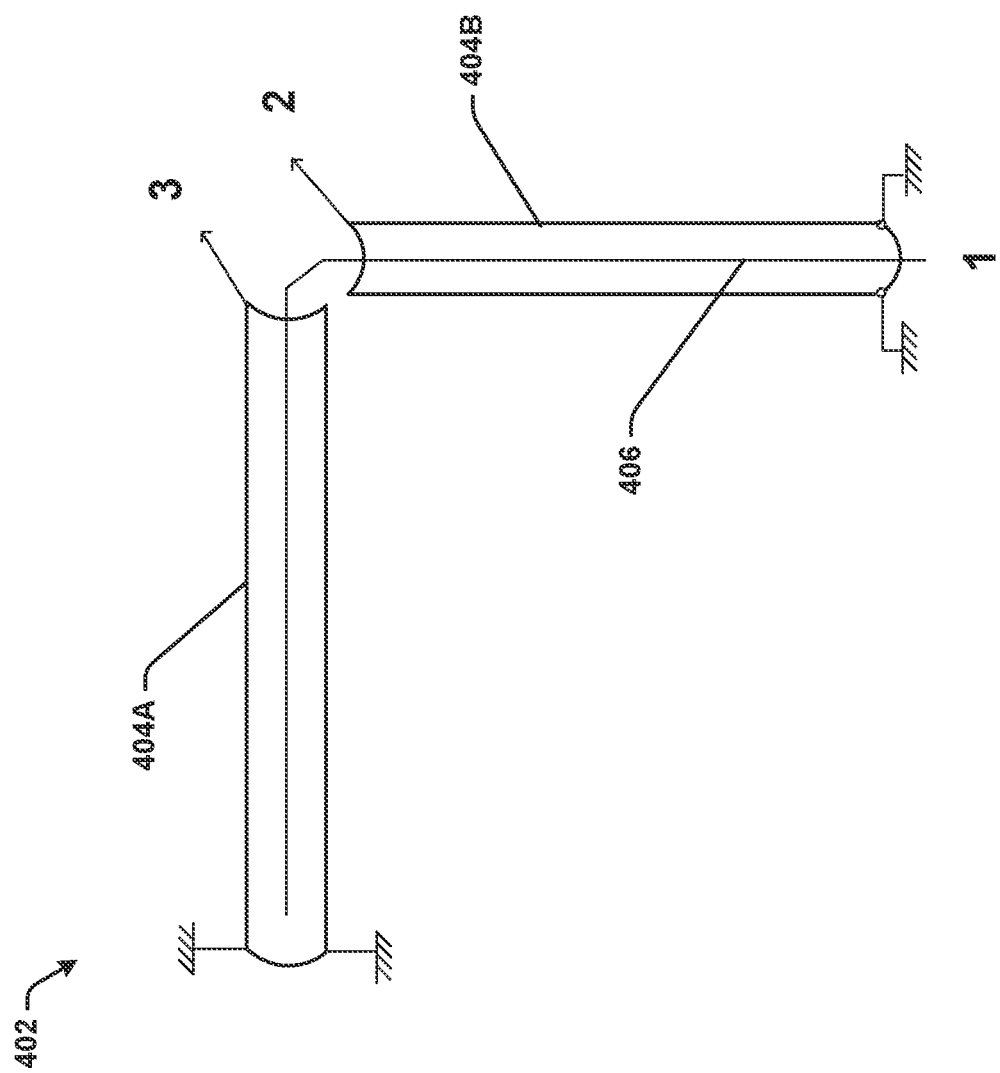
FIG. 4 is a circuit diagram of an example compensated microstrip balun comprising two coaxial transmission lines.

A coaxial compensated balun can operate at higher frequencies while having a smaller footprint. FIG. 4 is a circuit diagram of an example compensated microstrip balun 402 comprising two coaxial transmission lines 404A and 404B. Balun 402 is similar to transmission line balun 302 depicted in FIG. 3, assuming node 4 is connected to ground, except that node 1 (the input) does not connect directly to node 3 (the first output node). Instead, node 1 connects through an open stub (the center conductor 406 of the second transmission line 404B). Balun 402 can be implemented at least in part using microstrip building blocks. For example, the coaxial transmission lines 404A and 404B can be approximated using three coupled microstrip lines. This yields a planar balun architecture that can be implemented on a microchip substrate.

One or more embodiments described herein can further improve balun operation by expanding the balun's operating bandwidth, and by reducing or eliminating undesirable resonances on the differential output. To these ends, a transmission line balun having a structure similar to that of balun 302 (see FIG. 3) can be made planar to reduce its size using a microstrip substrate, and additional components can be added to increase the bandwidth and suppress resonance.

Figure 5:
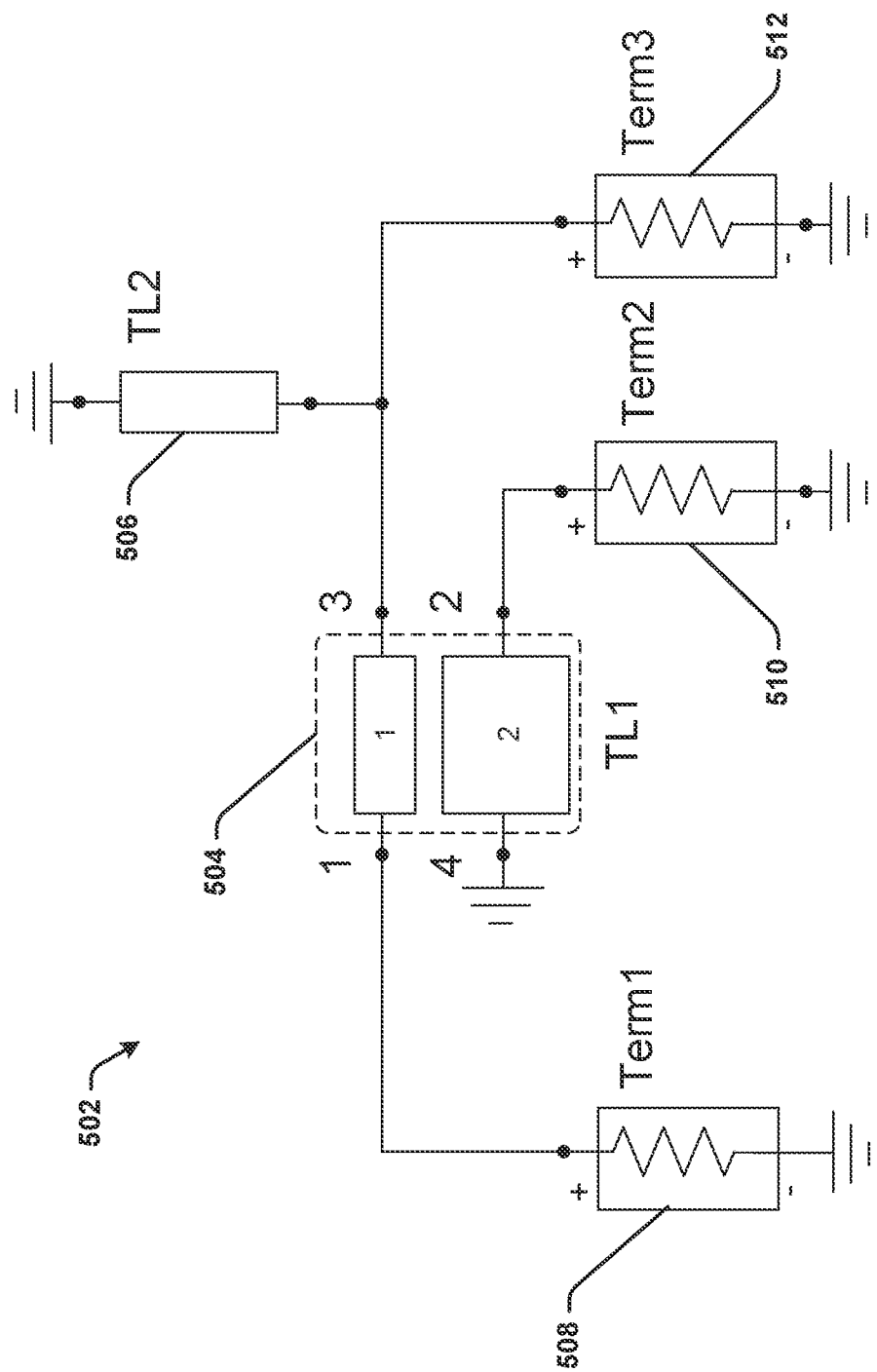
FIG. 5 is a circuit diagram of an example planar balun implemented using a microchip substrate.

FIG. 5 is a circuit diagram of an example planar balun 502 that has been made planar using a microchip substrate, thereby reducing the size of the balun 502 relative to balun 302 (illustrated in FIG. 3). The transformer of balun 502 is implemented as a coupled transmission line 504. For clarity, the nodes of the coupled transmission line 504 are labeled using the same node numbering convention (1 through 4) as the corresponding nodes of FIGS. 3 and 4. The coupled transmission line 504 can be implemented in substantially any manner, provided the coupling between the two conductors is high enough to achieve equal amplitude on the balun outputs. To achieve high coupling between the two conductors of the coupled transmission line 504, three adjacent lines can be used, as in FIG. 4. Alternatively, one conductor can be placed on top of the other with a thin dielectric layer between the two conductors. Larger bandwidth may be achieved if a dielectric with low permittivity (e.g., benzocyclobutene, polyimide, or another low permittivity dielectric) is used for this dielectric layer. Another transmission line 506 is connected between the output through leg and ground.

Figure 6:
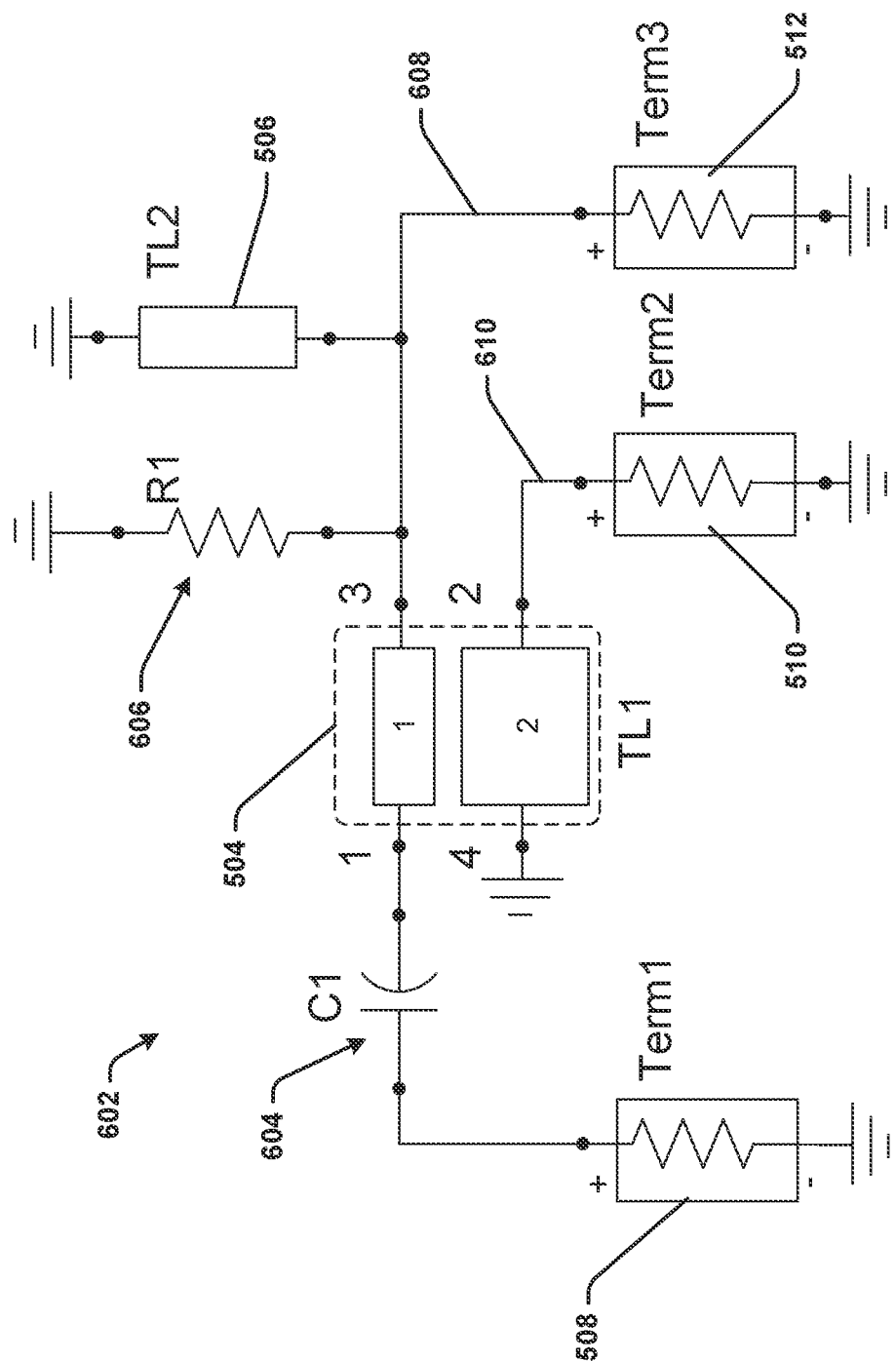
FIG. 6 is a circuit diagram of an example planar balun in which a capacitor (C1) and a resistor (R1) have been added.

To increase the balun's operating bandwidth and to suppress undesired resonances, two additional components can be added to the design depicted in FIG. 5. FIG. 6 is a circuit diagram of an example planar balun 602 in which a capacitor 604 (C1) and a resistor 606 (R1) have been added. Capacitor 604 is added in series with the balun's single-ended input, such that the capacitor 604 is installed between the input signal source (represented by source 508 in FIG. 6) and the input node (node 1) of the couple transmission line 504. Resistor 606 (or an equivalent resistive element or network) is installed in shunt with the first output node 608 such that the resistor 606 is in parallel with the transmission line 506, or connected in a path between the first output node 608 and ground.

Figure 7:
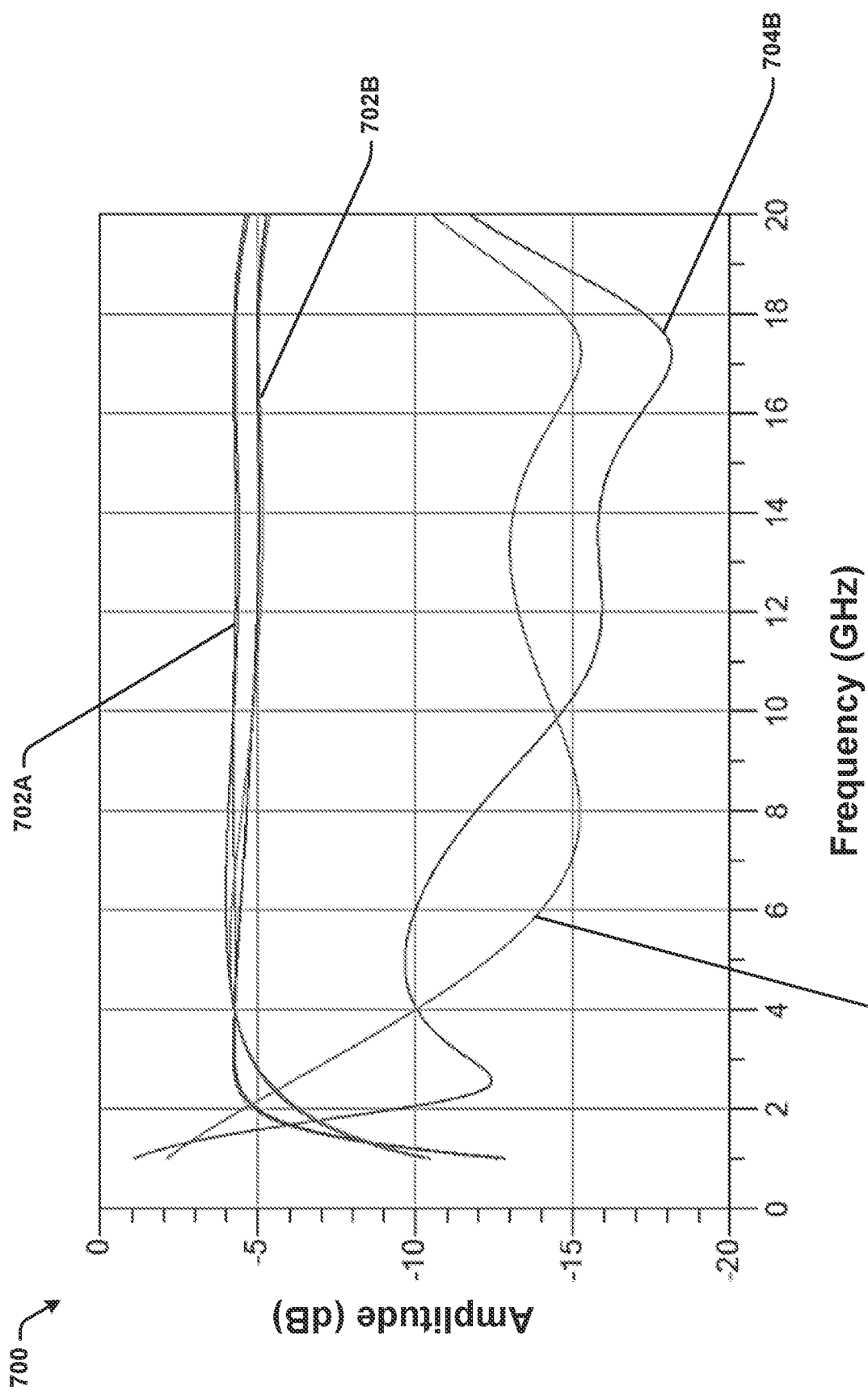
FIG. 7 is a graph that plots the insertion loss and return loss as a function of frequency for a balun without a capacitor at the input and a balun with the capacitor at the input.

Capacitor 604 extends the operating bandwidth of the balun 602 relative to balun 502. FIG. 7 is a graph 700 that plots the insertion loss in decibels (dB) and return loss in dB as a function of frequency (in GHz) for balun 502 (without capacitor 604) and balun 602 (with capacitor 604). Plots 702A and 704A represent the insertion loss in dB and return loss in dB, respectively, for balun 502 (without capacitor 604), and plots 702B and 704B are the insertion loss and return loss, respectively, for balun 602 (with capacitor 604). These plots represent an example simulation scenario for a planar balun on a gallium arsenide (GaAs) substrate with one benzocyclobutene (BCB) layer. Each of the insert loss plots 702A and 702B comprises two plots representing the insertion loss at the respective two balun output nodes 608 and 610 (see FIG. 5), as measured at loads 510 and 512 (see FIGS. 5 and 6).

As can be seen by comparing plots 702A and 702B, addition of capacitor 604 (illustrated in FIG. 6) extends the low end of the insertion loss bandwidth, such that the insertion loss for balun 602 (illustrated in FIG. 6) crosses-5 decibels (dB) at approximately 2 gigahertz (GHz), as compared with approximately 3 GHz for balun 502 (illustrated in FIG. 5). This represents an extension of the insertion loss bandwidth by approximately 1 GHz at the low end, allowing the balun 602 to operate at lower frequencies than would otherwise be possible. Adding capacitor 604 also extends the low end of the bandwidth for return loss, as can be seen by comparing plots 704A and 704B. For example, the return loss for balun 602 (plot 704B) crosses-10 dB at approximately 2 GHZ, whereas return loss for balun 502 (plot 704A) crosses-10 dB at approximately 4 GHz. This represents an extension of the return loss bandwidth of approximately 2 GHz at the low end.

Figure 8:
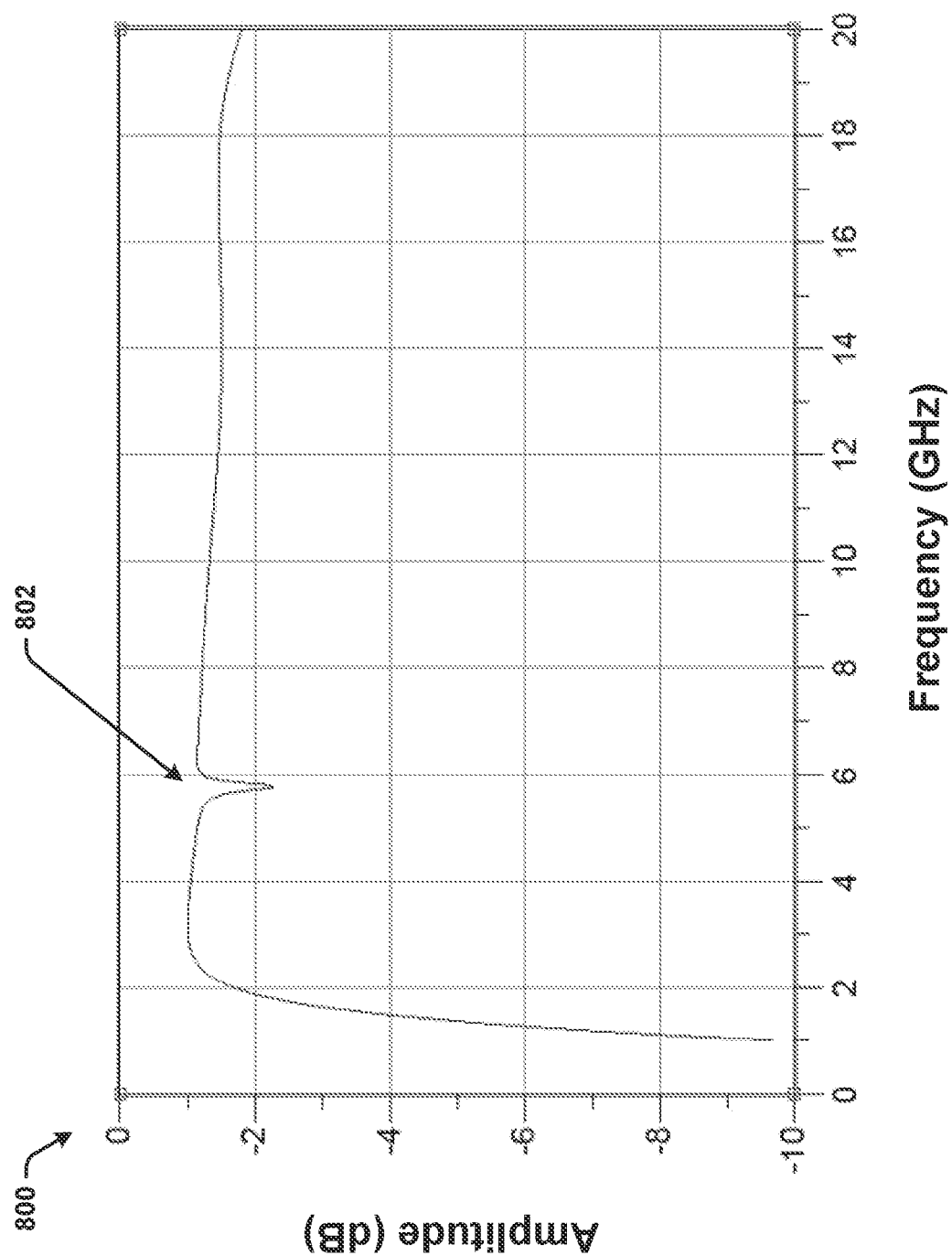
FIG. 8 is a graph that plots the single-ended to differential response for a balun without a resistor in shunt with one of the outputs in a scenario in which a single load is connected between the two differential outputs of the balun.

Addition of resistor 606 (illustrated in FIG. 6) solves a problem experienced by many wide band baluns. FIG. 8 is a graph 800 that plots the single-ended to differential response for balun 502 (illustrated in FIG. 5) in a scenario in which the two loads 510 and 512 are replaced with a single load connected between the two differential outputs 608 and 610 of the balun 502 (similar to load 114 depicted in FIGS. 1 and 2). As shown in this plot, there is a sharp drop in power, or glitch 802, at a particular resonance frequency (near 6 GHz in the illustrated example). This glitch 802 is caused by resonance in the transmission line 506 to ground (illustrated in FIGS. 5 and 6), which couples into the differential mode and creates the glitch 802. Transmission line 506 resonates with a finite quality factor Q and dissipates a portion of energy at the resonance frequency. This glitch 802 can be problematic in applications that operate across the frequency band. In theory, the balun is fully differential at the output and can be fully isolated from this common mode resonance. However, in practice, there may be phase and amplitude mismatches, the isolation is limited, and some of the output power can couple to the resonator and become dissipated.

Figure 9:
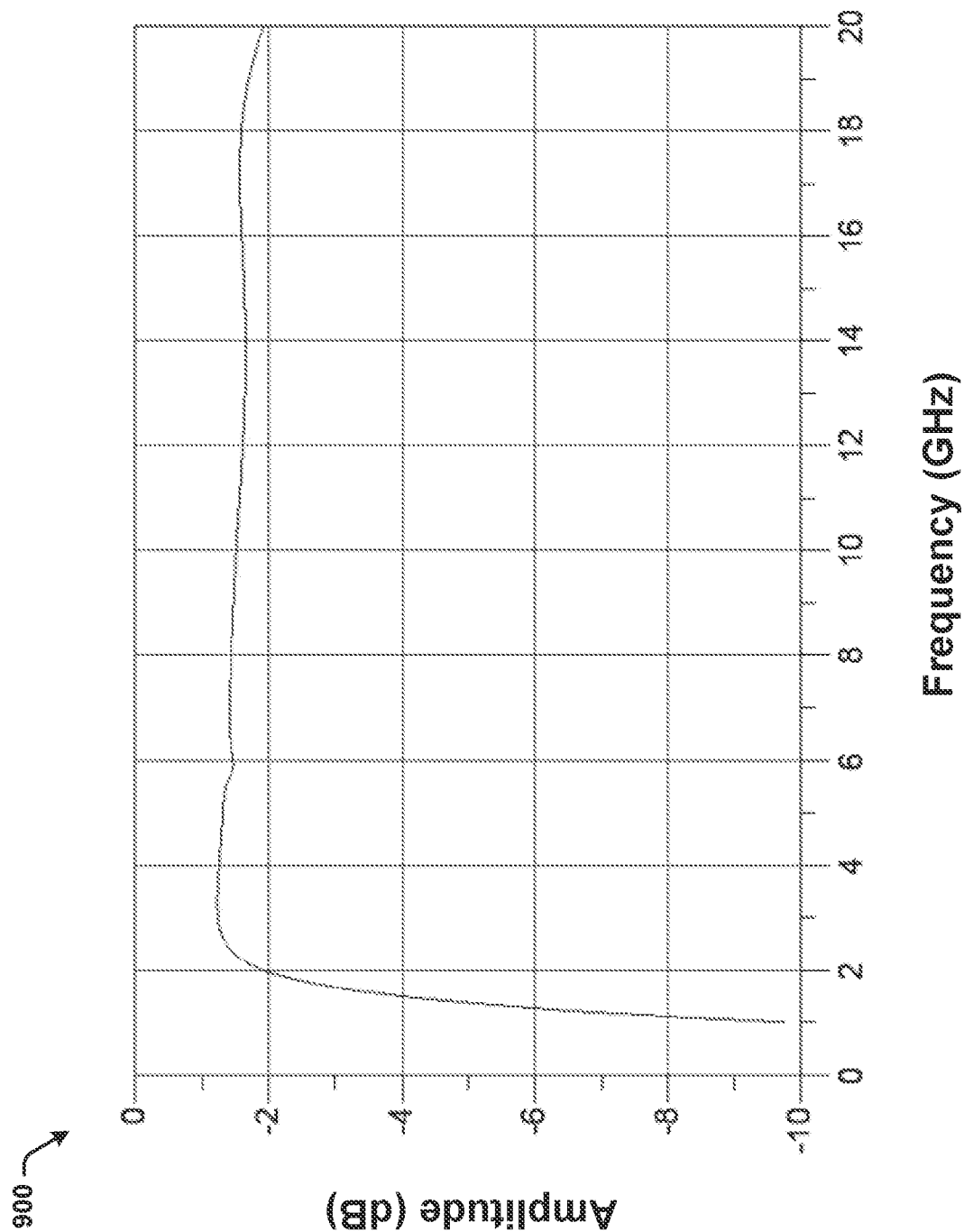
FIG. 9 is a graph that plots the single-ended to differential response for a balun that includes a resistor in shunt with one of the outputs.

The glitch 802 is not seen when the two output nodes 608 and 610 are terminated to ground (e.g., via loads 510 and 512), as in the example configurations of FIGS. 5 and 6 since, although resonance is still present, the loaded quality factor Q is low and the resonance bandwidth is wide in that configuration. This causes the energy loss to be distributed across a wide bandwidth. To achieve a similar result when a load is placed across the two output nodes 608 and 610 (illustrated in FIG. 6) (e.g., as with load 114 in FIGS. 1 and 2), resistor 606 is added to serve as a fixed termination inside balun 602. FIG. 9 is a graph 900 that plots the single-ended to differential response for balun 602, which includes resistor 606 (illustrated in FIG. 6). Adding resistor 606 in parallel with transmission line 506 reduces the loaded quality factor Q and widens the resonance, such that the energy loss is spread out across a greater portion of the bandwidth rather than being focused around a resonance frequency. As demonstrated by plot 900, balun 602 (illustrated in FIG. 6) produces a more continuous frequency response, even across the resonance frequency, relative to balun 502 (illustrated in FIG. 5). Resistor 606 can be included as part of the design of balun 602 even if it is unknown whether the balun load will be differential or will comprise two terminations to ground. In some implementations, addition of resistor 606 only increases the balun loss by approximately 0.25 dB.

Figure 10:
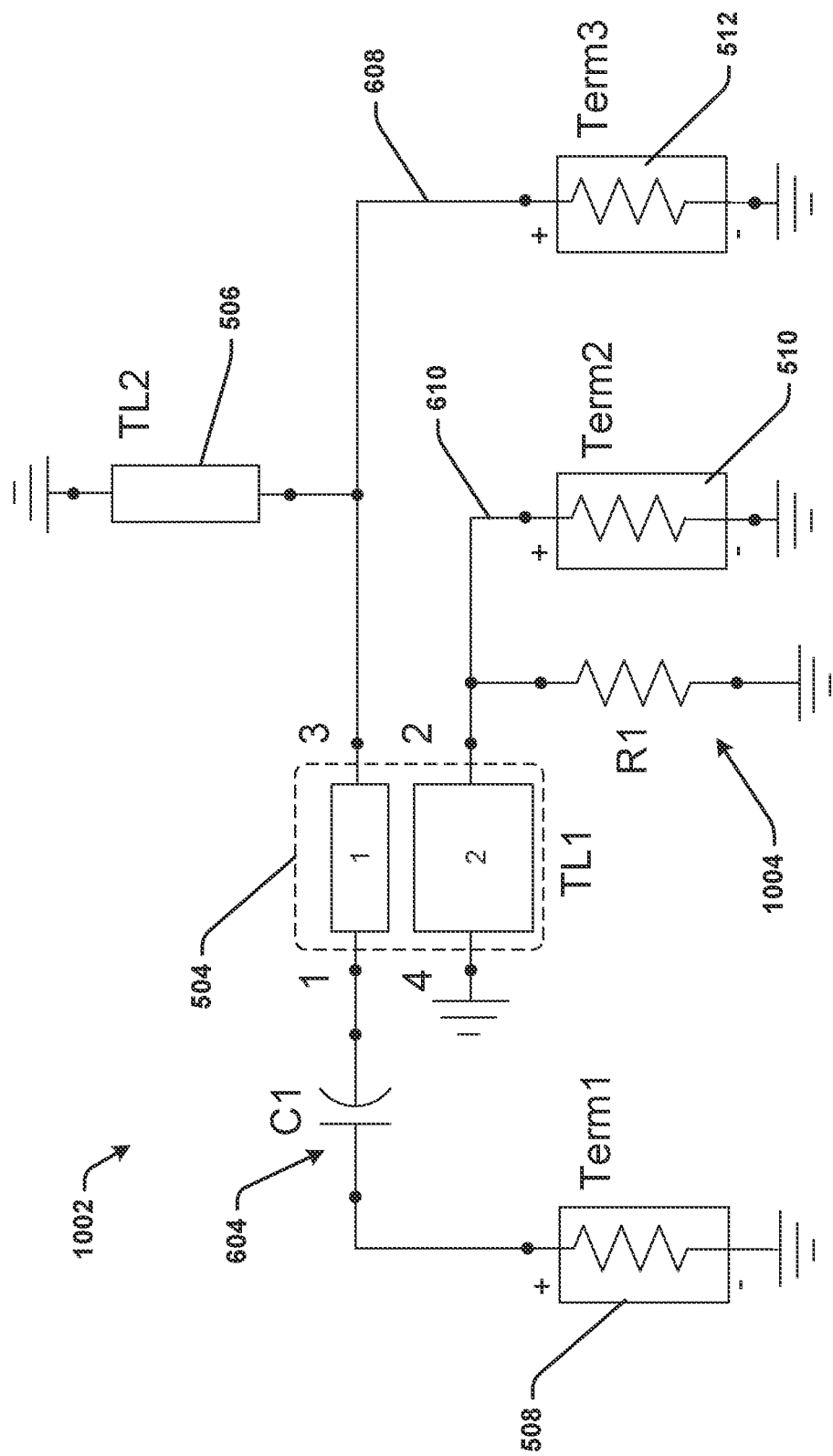
FIG. 10. is a circuit diagram of an example planar balun that includes capacitor (C1) and a resistor (R1) in which the resistor is connected between the second output node and ground.
Figure 11:
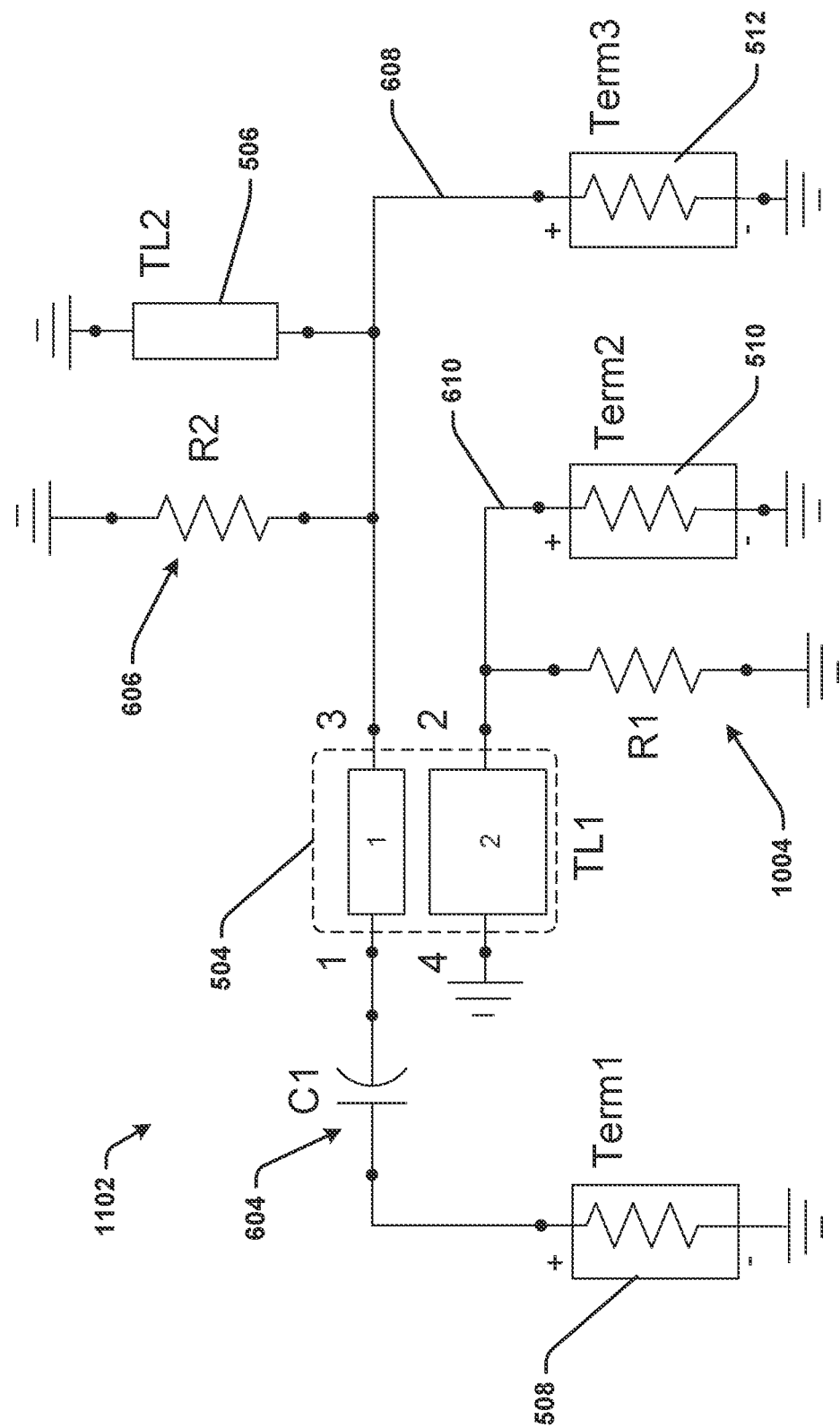
FIG. 11 is a circuit diagram of an example planar balun that includes capacitor (C1), a first resistor (R1) connected between the second output node and ground, and a second resistor (R2) connected between the first output node and ground.

Although the balun 602 illustrated in FIG. 6 depicts a resistor 606 being connected between the first output node 608 and ground, such that the resistor 606 is in parallel with transmission line 506, in some embodiments a resistor can alternatively be connected between the second output node 610 and ground. FIG. 10 is a circuit diagram of another example planar balun 1002 that includes capacitor 604 (C1) (similar to balun 602) and a resistor 1004 (R1), in which the resistor 1004 is connected in a path between the second output node 610 and ground. This design can achieve similar benefits to those of balun 602. Other embodiments may incorporate both resistors. FIG. 11 is a circuit diagram of another example planar balun 1102 that includes capacitor 604 (C1) (similar to baluns 602 illustrated in FIGS. 6 and 1002 illustrated in FIG. 10), a first resistor 1004 (R1) connected between the second output node 610 and ground, and a second resistor 606 (R2) connected between the first output node 608 and ground.

Figure 12:
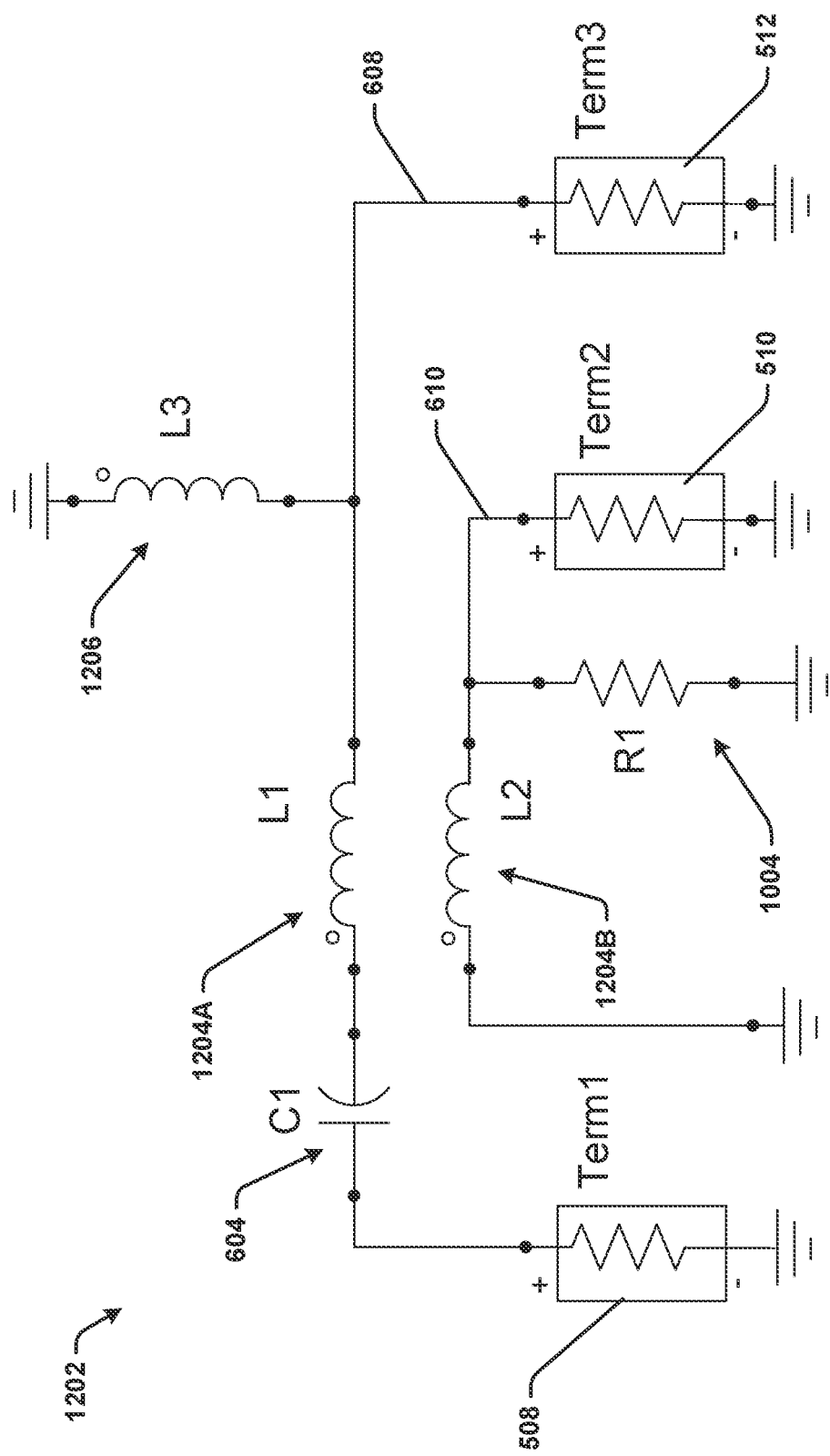
FIG. 12. is a circuit diagram of an example planar balun that has a similar design to that of balun depicted in FIG. 10, but which replaces the transmission line of the balun depicted in FIG. 10 with spiral inductors.

Any of the example planar baluns 602 (FIG. 6.), 1002 (FIG. 10), or 1102 (FIG. 11) described above can also be implemented using spiral inductors in place of one or more of the straight transmission lines. FIG. 12 is a circuit diagram of another example planar balun 1202 that has a similar design to that of balun 1002 depicted in FIG. 10, but which replaces the coupled transmission line 504 with two adjacent spiral inductors 1204A and 1204B having mutual inductance, and which replaces transmission line 506 with another spiral inductor 1206. Although the example depicted in FIG. 12 depicts all of the transmission lines being replaced with inductors, some embodiments may replace only a subset of the transmission lines with inductors, such that the resulting balun comprises a combination of straight transmission lines and inductors. The use of spiral inductors 1204A, 1204B, and 1206 in place of straight transmission lines 504 and 506 can yield more compact layouts at lower frequencies.

Figure 13:
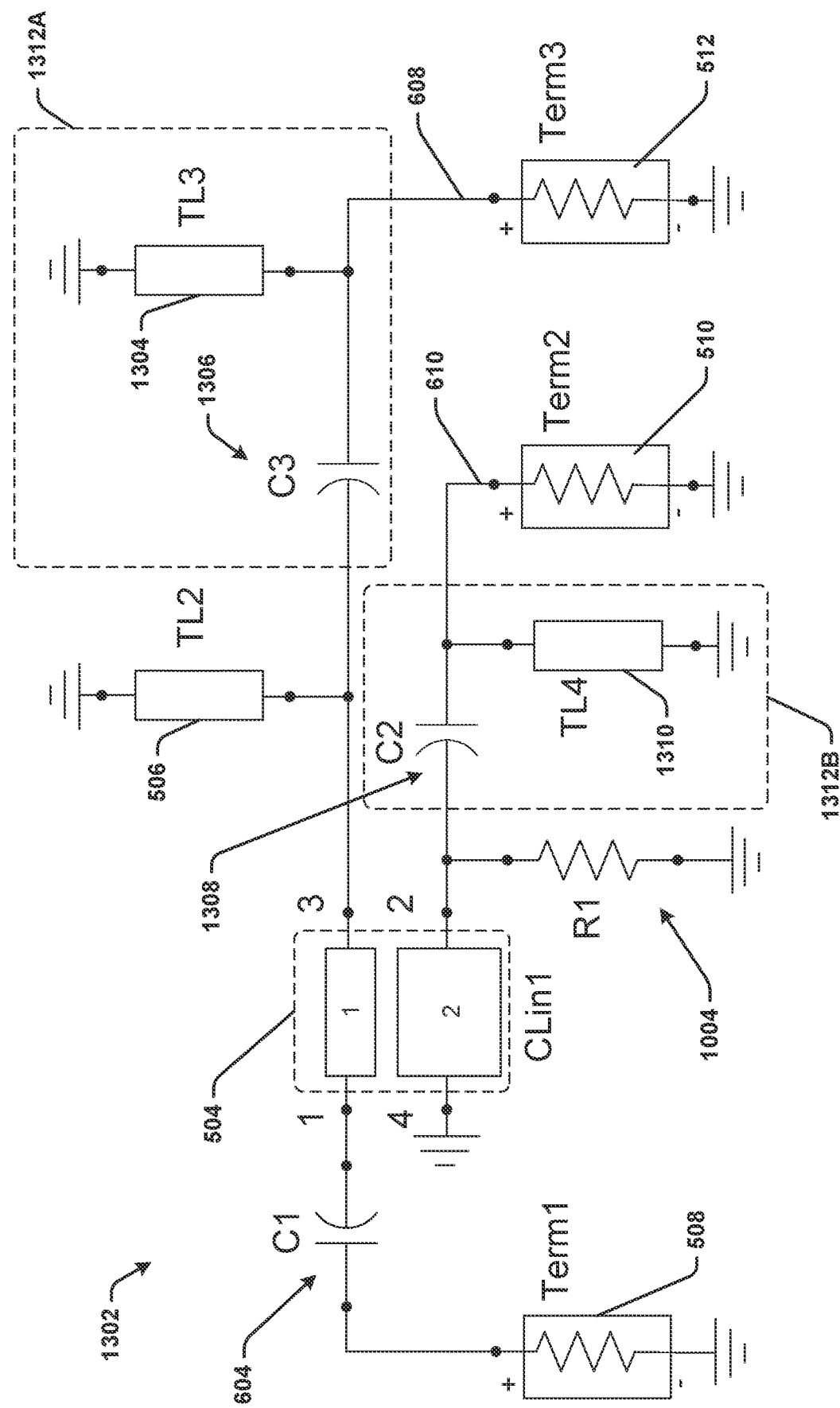
FIG. 13 is a circuit diagram of an example planar balun that modifies the design of the balun depicted in FIG. 10 by adding high-pass filters before each of the two output nodes.

The bandwidth of any of the planar baluns described above (e.g., baluns 602 (FIG. 6.), 1002 (FIG. 10), 1102 (FIG. 11), 1202 (FIG. 12), or the associated variations described above) can be further improved by the addition of other components. FIG. 13 is a circuit diagram of another example planar balun 1302 that modifies the design of balun 1002 (illustrated in FIG. 10) by adding high-pass filter sections 1312A and 1312B upstream from each of the two output nodes 610 and 608. In balun 1002 (illustrated in FIG. 10) (and similarly baluns 602, 1102, 1202, and their variants), there are inductors to ground at each of the output nodes 610 and 608; namely, transmission line 506 and a transmission line of the coupled transmission line 504. Embedding each of these inductors in a high-pass filter can lower the cutoff frequency of the resulting balun 1302 without increasing the inductance.

To achieve the lower cutoff frequency, another transmission line 1304 (TL3) is installed in shunt with the first output node 608 such that the transmission line 1304 is connected in a path between the first output node 608 and ground (in parallel with the load 512), and a series capacitor 1306 (C3) is connected in a path between the couple transmission line 504 and the new transmission line 1304. Similarly, a new transmission line 1310 (TL4) is installed in shunt with the second node 512 such that the transmission line 1310 is connected in a path between the second output node 610 and ground (in parallel with load 510), and a new series capacitor 1308 (C2) is installed between the coupled transmission line 504 and the new transmission line 1310.

Figure 14:
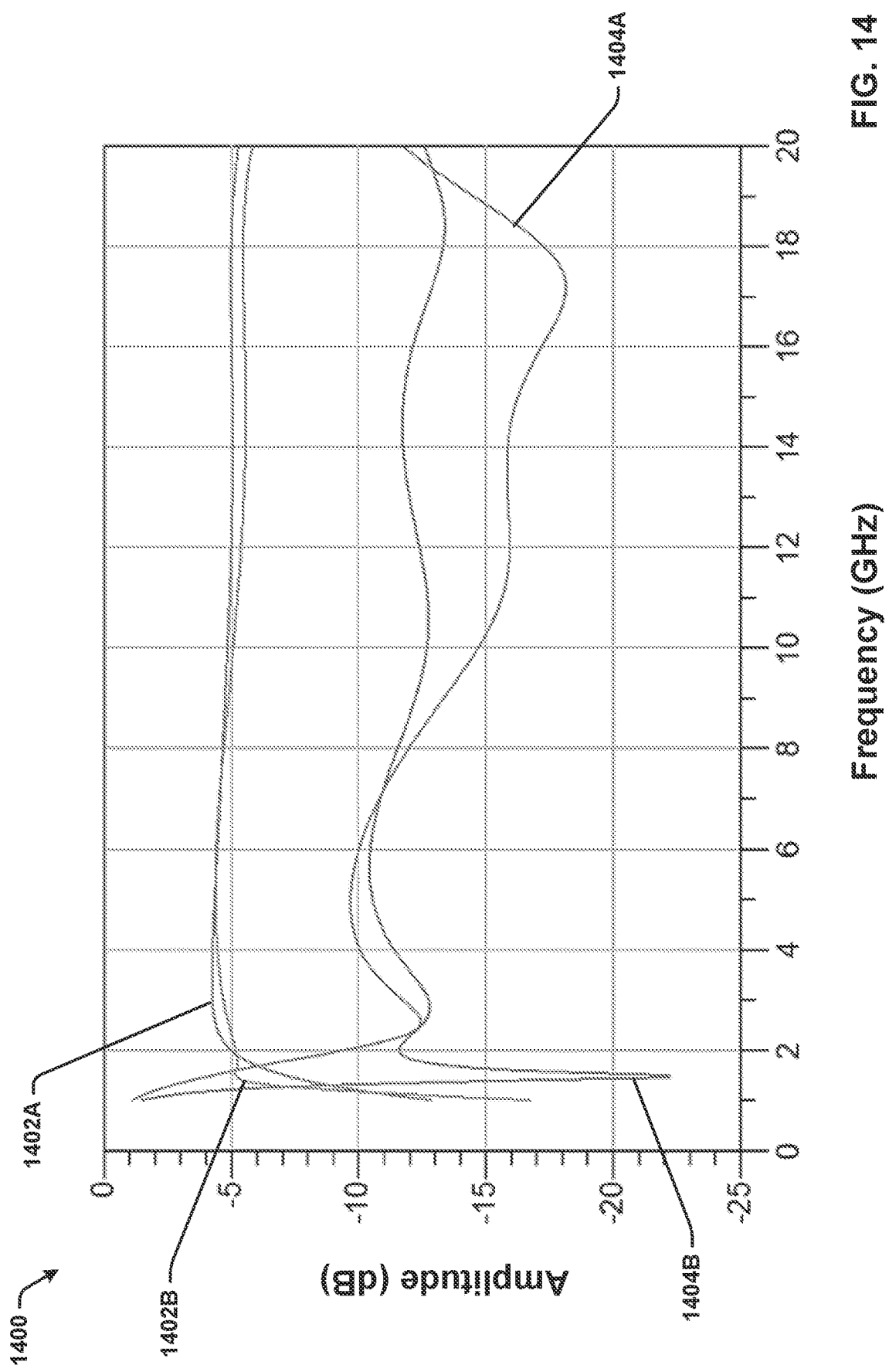
FIG. 14 is a graph that plots the insertion loss and return loss as a function of frequency for balun the balun depicted in FIG. 10 (without high-pass filter sections) and the balun depicted in FIG. 13.

This modification effectively adds two new high-pass filter sections 1312A and 1312B to the two output nodes 608 and 610, respectively. These high-pass filter sections 1312A and 1312B lower the corner or cutoff frequencies of the balun's operating bandwidth relative to balun 1002 (illustrated in FIG. 10) without degrading high end frequencies. FIG. 14 is a graph 1400 that plots the insertion loss in dB and return loss in dB as a function of frequency (in GHz) for balun 1002 (illustrated in FIG. 10) (without high-pass filter sections 1312A and 1312B (illustrated in FIG. 13)) and balun 1302 (illustrated in FIG. 13) (with high-pass filter sections 1312A and 1312B added). Plots 1402A and 1404A represent the insertion loss and return loss, respectively, for balun 1002 (without high-pass filter sections 1312A and 1312B), and plots 1402B and 1404B are the insertion loss and return loss, respectively, for balun 1302 (with high-pass filter sections 1312A and 1312B added). As can be seen by comparing plots 1402A and 1402B, addition of sections 1312A and 1312B lowers the low-end cutoff frequency of the balun's operating bandwidth. Adding sections 1312A and 1312B also extends the low end of the bandwidth for return loss relative to balun 1002, as can be seen by comparing plots 1404A and 1404B.

Figure 15:
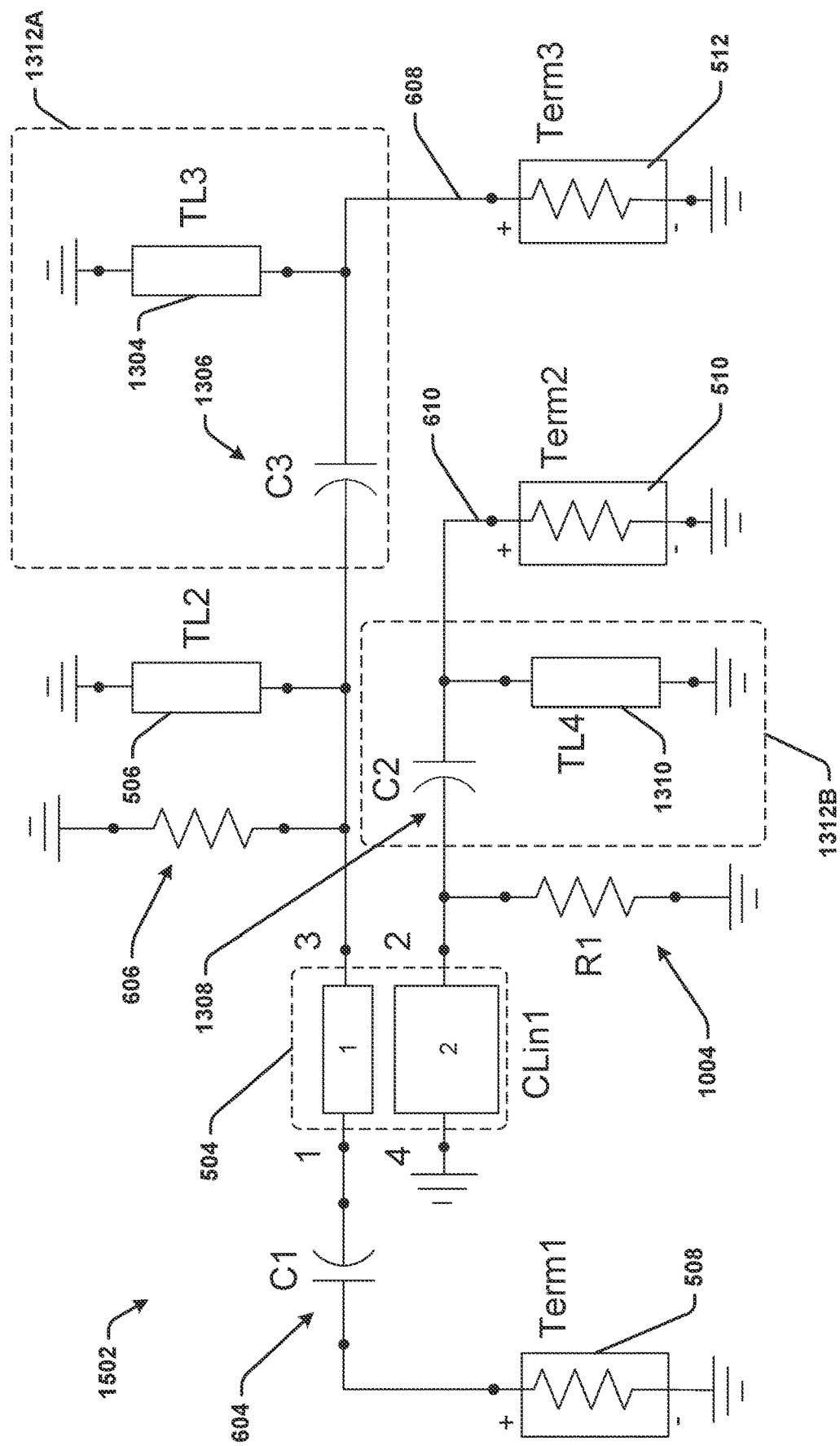
FIG. 15 is a circuit diagram of an example balun that modifies the balun depicted in FIG. 13 by adding a second resistor in shunt with transmission line.

Although the example balun 1302 illustrated in FIG. 13 depicts a single resistor 1004 (R1) connected between the input of the high pass filter section 1312B and ground, balun 1302 may alternatively or additionally include a resistor 606 connected in shunt with transmission line 506. FIG. 15 is a circuit diagram of another example balun 1502 that modifies the design of balun 1302 by adding a second resistor 606 in shunt with transmission line 506. Resistor 606 is connected on the side of the transmission line 506 opposite the high-pass filter section 1312A. Other embodiments may include resistor 606 while omitting resistor 1004.

Figure 16:
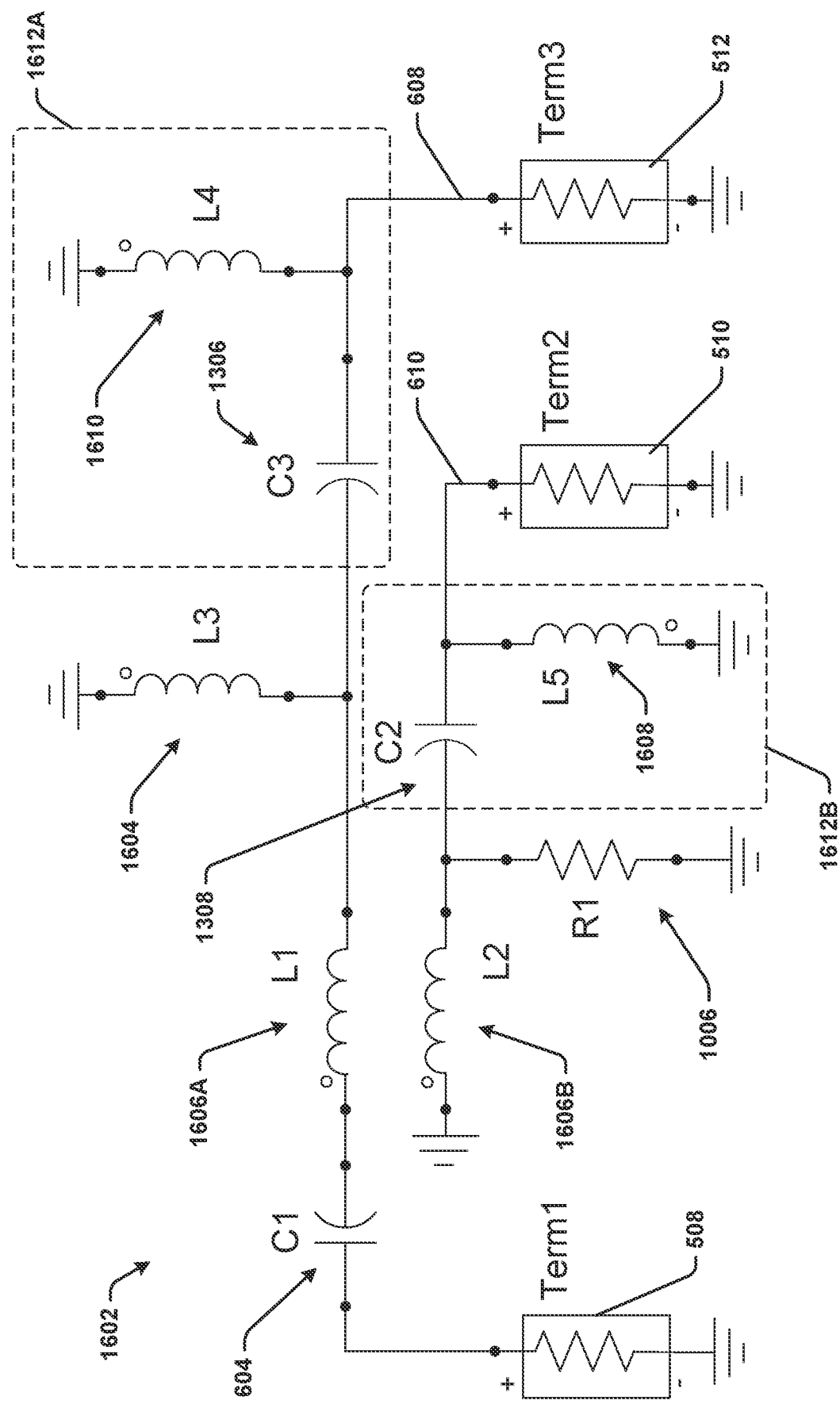
FIG. 16 is a circuit diagram of another planar balun that modifies the balun depicted in FIG. 13 by replacing the transmission lines with spiral inductors.

As in the case of other balun designs discussed above, balun 1302 (illustrated in FIG. 13) can be implemented using spiral inductors in place of straight transmission lines. FIG. 16 is a circuit diagram of another example planar balun 1602 that has a similar design to that of balun 1302 depicted in FIG. 13, but which replaces the coupled transmission line 504 with two adjacent spiral inductors 1606A and 1606B having mutual inductance, and which replaces transmission lines 506, 1310, and 1304 with spiral inductors 1604, 1608, and 1610, respectively.

Relative to balun 1202 depicted in FIG. 12, balun 1602 adds high-pass filter sections 1612A and 1612B to the output nodes 608 and 610, respectively (similar to balun 1302). In this case, each high-pass filter section 1612A and 1612B comprises a series capacitor 1306 or 1308 and a shunt inductor 1610 or 1608. This design can improve the operating bandwidth in a manner similar to balun 1302 while yielding more compact layouts at lower frequencies.

The baluns described herein (e.g., baluns 602 (FIG. 6), 1002 (FIG. 10), 1102 (FIG. 11), 1202 (FIG. 12), 1302 (FIG. 13), 1502 (FIG. 15), 1602 (FIG. 16), and variations described herein) can be used in any type of application requiring differential signals, high isolation, or low second order distortion, including but not limited to double balanced mixers, antenna circuits, or other such systems.

Figure 17:
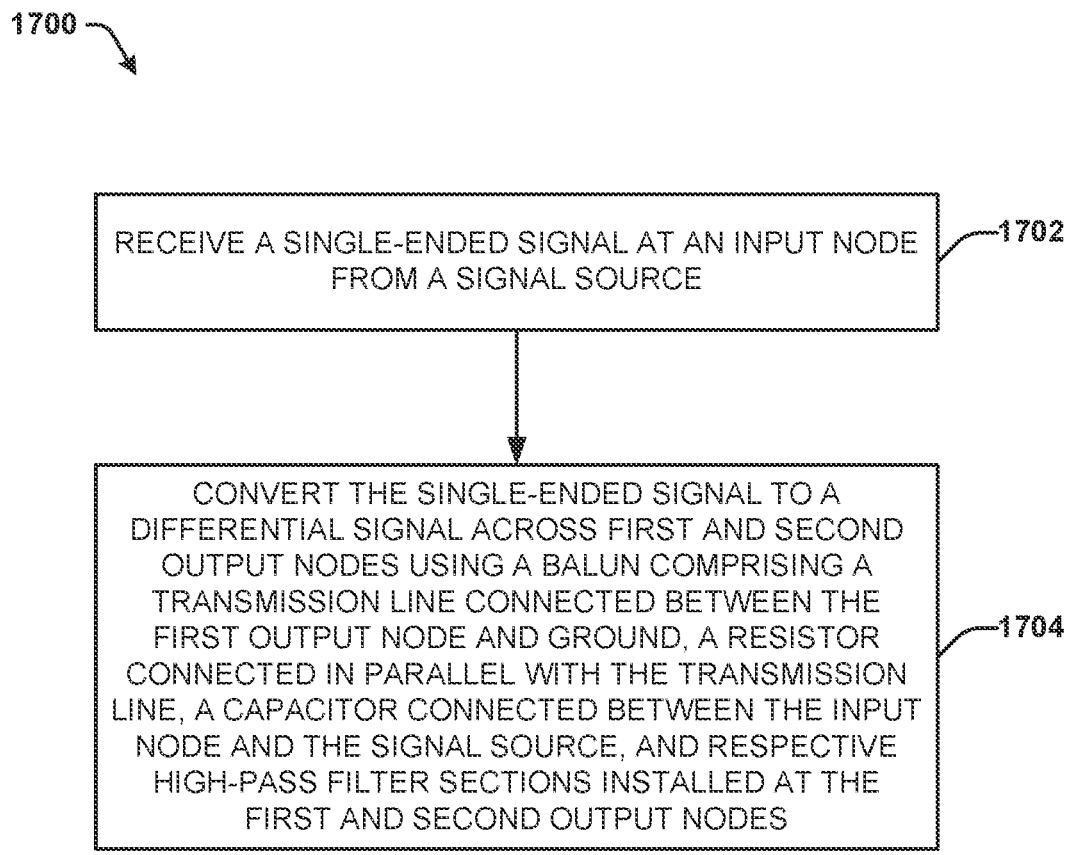
FIG. 17 is a flow diagram of an example, non-limiting methodology for converting a single-ended signal to a differential signal using a balun having an expanded operating bandwidth and reduced resonances on the differential output.

FIG. 17 illustrates a methodology 1700 in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Referring to FIG. 17, a flow diagram of an example, non-limiting methodology 1700 for converting a single-ended signal to a differential signal using a balun having an expanded operating bandwidth and reduced resonances on the differential output is shown. Initially, at 1702, a single-ended signal is received at an input node from a signal source. At 1704, the single-ended signal is converted to a differential signal across first and second output nodes using a balun. The balun comprises a transmission line connected between the first output node and ground, a resistor (or resistive network) connected in parallel with the transmission line, a capacitor connected between the input node and the signal source, and respective high-pass filter sections installed at the first and second output nodes. These circuit elements can extend the operational bandwidth of the balun, allowing the balun to operate at lower frequencies relative to other balun designs. These elements can also suppress resonances that otherwise cause sudden power drops at a resonance frequency while a load is connected between the balun's differential outputs.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as "bits", "values", "elements", "symbols", "characters", "terms", "numbers", or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as "processing", "computing", "calculating", "determining", or "displaying", and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A circuit for converting a single-ended signal to a differential signal, comprising:
   an input node configured to receive a single-ended signal;
   a first output node and a second output node configured to output a differential signal based on the single-ended signal;
   a first series capacitor on the first output node;
   a first transmission line connected between the first output node and ground;
   a second series capacitor on the second output node;
   a second transmission line connected between the second output node and ground; and
   at least one of a resistor connected in parallel with the first transmission line or a second resistor connected in parallel with the second transmission line.

2. The circuit of claim 1, further comprising a capacitor connected in series with the input node.

3. A balun, comprising:
   circuitry configured to convert a single-ended signal received at an input node to a differential signal and to output the differential signal across a first output node and a second output node;
   a first high-pass filter connected between the input node and the first output node;
   a second high-pass filter separate from the first high-pass filter and connected between the input node and the second output node; and
   at least one of a resistor connected between an input of the first high-pass filter and ground or a second resistor connected between an input of the second high-pass filter and ground.

4. The balun of claim 1, wherein the first high-pass filter comprises:
   a transmission line connected between the first output node and ground, and
   a series capacitor connected to the first output node.

5. The balun of claim 1, wherein the circuitry further comprises a transformer implemented as a coupled transmission line.

6. The balun of claim 5, wherein the second high-pass filter comprises:
   a transmission line connected between the second output node and ground, and
   a series capacitor connected in a path between an output of the coupled transmission line and the second output node.

7. The balun of claim 5, wherein the coupled transmission line comprises microstrip lines.

8. The balun of claim 1, wherein the circuitry further comprises a transformer implemented as a pair of spiral inductors.

9. The balun of claim 1, wherein the balun is a planar balun implemented on a microchip substrate.

10. A telecommunications device comprising the balun of claim 1.

11. The balun of claim 1, further comprising a capacitor connected in a path between the input node and a source of the single-ended signal.

12. A method, comprising:
   receiving, at an input node of a balun, a single-ended signal from a signal source; and
   converting the single-ended signal to a differential signal across a first output node and a second output node of the balun,
   wherein the balun comprises:
      a first high-pass filter connected between the input node of the balun and the first output node,
      a second high-pass filter separate from the first high-pass filter and connected between the input node of the balun and the second output node, and
      a resistor connected between an input of the second high-pass filter and ground.

13. The method of claim 12, wherein the balun further comprises a capacitor connected in a path between the input node and a source of the single-ended signal.

14. The method of claim 12, wherein the balun further comprises a resistor connected in shunt with a transmission line.

15. The method of claim 12, wherein the first high-pass filter comprises:
   a transmission line connected between the first output node and ground, and
   a series capacitor connected to the first output node.

16. The method of claim 12, wherein the balun further comprises a transformer implemented as a coupled transmission line.

17. The method of claim 16, wherein the second high-pass filter comprises:
   a transmission line connected between the second output node and ground, and
   a series capacitor connected in a path between an output of the coupled transmission line and the second output node.

* * * * *